United States Patent
Chu

(10) Patent No.: US 7,580,310 B2
(45) Date of Patent: *Aug. 25, 2009

(54) SELF REFRESH CONTROL DEVICE

(75) Inventor: Shin-Ho Chu, Ichon-shi (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/000,956

(22) Filed: Dec. 19, 2007

(65) Prior Publication Data

US 2008/0101134 A1    May 1, 2008

Related U.S. Application Data

(63) Continuation of application No. 11/318,594, filed on Dec. 28, 2005, now Pat. No. 7,327,626.

(30) Foreign Application Priority Data

Aug. 17, 2005    (KR)    .................... 10-2005-0075256

(51) Int. Cl.
*G11C 7/00* (2006.01)
(52) U.S. Cl. .................................. 365/222; 365/189.09
(58) Field of Classification Search ................. 365/222, 365/189.09, 189.05, 189.11, 203, 226
See application file for complete search history.

(56) References Cited

U.S. PATENT DOCUMENTS

| 4,460,835 | A | | 7/1984 | Masuoka | |
|---|---|---|---|---|---|
| 5,315,166 | A | | 5/1994 | Arimoto | |
| 5,461,338 | A | * | 10/1995 | Hirayama et al. | 327/534 |
| 5,610,533 | A | * | 3/1997 | Arimoto et al. | 326/33 |
| 5,805,508 | A | | 9/1998 | Tobita | |
| 5,874,851 | A | * | 2/1999 | Shiota | 327/537 |
| 5,886,932 | A | | 3/1999 | Choi | |
| 6,137,742 | A | | 10/2000 | Jung | |
| 6,333,886 | B2 | | 12/2001 | Cho et al. | |
| 6,421,281 | B2 | | 7/2002 | Suzuki | |
| 6,487,105 | B2 | | 11/2002 | Morihara et al. | |

(Continued)

FOREIGN PATENT DOCUMENTS

JP    10-064259    3/1998

(Continued)

OTHER PUBLICATIONS

Korean Office Action issued in corresponding Korean Patent Application No. 10-2005-0075256, Dated Jun. 27, 2006.

(Continued)

*Primary Examiner*—Gene N. Auduong
(74) *Attorney, Agent, or Firm*—Mannava & Kang, P.C.

(57) ABSTRACT

Disclosed herein is a self refresh control device for reducing a current leakage of transistors in off-state. The apparatus for controlling a voltage used in a semiconductor memory device includes a first voltage supplying block for supplying a first voltage to the semiconductor memory device in response to an inputted control signal; and a second voltage supplying block for supplying a second voltage to the semiconductor memory device in response to the inputted control signal, wherein the first and the second voltages are used as a bulk voltage of a transistor included in the semiconductor memory device.

23 Claims, 8 Drawing Sheets

U.S. PATENT DOCUMENTS

| | | |
|---|---|---|
| 6,501,117 B1 | 12/2002 | Raden et al. |
| 6,781,908 B1 | 8/2004 | Pelley et al. |
| 6,882,215 B1 | 4/2005 | Lee |

FOREIGN PATENT DOCUMENTS

| | | |
|---|---|---|
| KR | 1996-0035625 | 4/1998 |
| KR | 0142953 | 4/1998 |
| KR | 10-2005-0086255 | 8/2005 |
| KR | 2005-0086255 | 8/2005 |
| TW | 301750 | 4/1997 |
| TW | 371756 | 10/1999 |

OTHER PUBLICATIONS

Konishi, et al., "A 38-ns 4-Mb DRAM with a Battery-Backup (BBU) Mode," IEEE Journal of Solid State Circuits, Oct. 1990, vol. 25, No. 5.

Taiwanese Office Action and Search Report, w/ English translation thereof, issued in Patent Application No. TW 094147415 dated on Jul. 18, 2008.

* cited by examiner

SELF REFRESH CONTROL DEVICE

RELATED APPLICATIONS

This application is a Continuation of U.S. application Ser. No. 11/318,594, filed Dec. 28, 2005, now U.S. Pat. No. 7,327,626 claiming priority of Korean Application No. 10-2005-0075256, filed Aug. 17, 2005, the entire contents of each of which are hereby incorporated by reference.

FIELD OF THE INVENTION

The present invention relates to a self refresh control device; and, more particularly, to a self refresh control device for reducing a current leakage in off-state of transistors during self refresh operation.

DESCRIPTION OF RELATED ARTS

A dynamic random access memory (DRAM) has an integration degree larger than other memory device.

Recently, according to a high-speed operation demand, various techniques are proposed so that an operation speed of DRAM is dramatically increased.

FIG. 1 is a circuit diagram showing a conventional circuit of a semiconductor memory device including MOS transistors.

Herein, a predetermined circuit including at least one MOS transistor 10 is explained.

As shown, the predetermined circuit including at least one MOS transistor 10 includes a PMOS transistor C_P1 and a NMOS transistor C_N1. In general, the PMOS transistor C_P1 is connected between a source voltage VDD and the NMOS transistor C_N1. The NMOS transistor C_N1 is connected between the PMOS transistor C_P1 and a ground voltage VSS. Herein, the source voltage VDD is supplied to a source and a bulk of the PMOS transistor C_P1, and the ground voltage VSS is supplied to a source and a bulk of the NMOS transistor C_N1.

FIG. 2 is a circuit diagram showing a conventional self refresh generating circuit block 20.

The self refresh generating circuit block 20 is required to generate a self refresh signal SRFP.

As shown, the conventional self refresh generating circuit block 20 includes a first inverter C_IV1, a second inverter C_IV2 and a NAND gate C_ND1. The NAND gate C_ND1 performs a NAND operation of an internal self refresh signal ISRFP inverted by the first inverter C_IV1 and an external self refresh signal ESRFP inverted by the second inverter C_IV2 to output a self refresh signal SRFP.

If the external self refresh signal ESRFP having a logic level 'HIGH' is inputted to the conventional self refresh generating circuit block 20, the self refresh signal SRFP is activated. Accordingly, a refresh operation is performed during a self refresh period. The refresh operation is performed repeatedly at a predetermined period, in general about several tens of microsecond (μs).

In the mean time, the self refresh operation is performed not only by the external self refresh signal ESRFP inputted from an external but also by the internal self refresh signal ISRFP which is internally generated at a predetermined period or when a specific condition is met.

However, as the semiconductor memory device is more integrated, a gate length of transistors becomes smaller and a threshold voltage of the transistors becomes lower. Therefore, when the transistors are in off-state, a leakage current of the transistors is increased so that there is a limitation to reduce a current consumption.

SUMMARY OF THE INVENTION

It is, therefore, an object of the present invention to provide a self refresh control device for reducing a self refresh current to thereby reduce a leakage current in off-state of transistors during self refresh operation by raising a bulk voltage of a PMOS transistor and going down a bulk voltage of a NMOS transistor.

In accordance with an aspect of the present invention, there is provided a self refresh control device including a first voltage supplying block for supplying a first voltage to the semiconductor memory device in response to an inputted control signal; and a second voltage supplying block for supplying a second voltage to the semiconductor memory device in response to the inputted control signal.

In accordance with another aspect of the present invention, there is provided a self refresh control device including a plurality of first circuit units, each of first circuit units including a first MOS transistor and a second MOS transistor connected between a first source voltage and a first ground voltage in series; a second circuit unit including a third MOS transistor and a fourth MOS transistor connected between the first source voltage and the first ground voltage in series; and a plurality of voltage supplying units for supplying a second source voltage higher than the first source voltage to a bulk of the first MOS transistor and a second ground voltage lower than the first ground voltage to a bulk of the second MOS transistor when starting a self refresh operation; and supplying the first source voltage to the bulk of the first MOS transistor and the first ground voltage to the bulk of the second MOS transistor when finishing the self refresh operation, wherein each of voltage supplying units is provided with each of corresponding first circuit units.

BRIEF DESCRIPTION OF THE DRAWINGS

The above and other objects and features of the present invention will become better understood with respect to the following description of the specific embodiments given in conjunction with the accompanying drawings, in which.

DETAILED DESCRIPTION OF THE INVENTION

Hereinafter, a self refresh control device in accordance with an embodiment of the present invention will be described in detail referring to the accompanying drawings.

Figure 3:
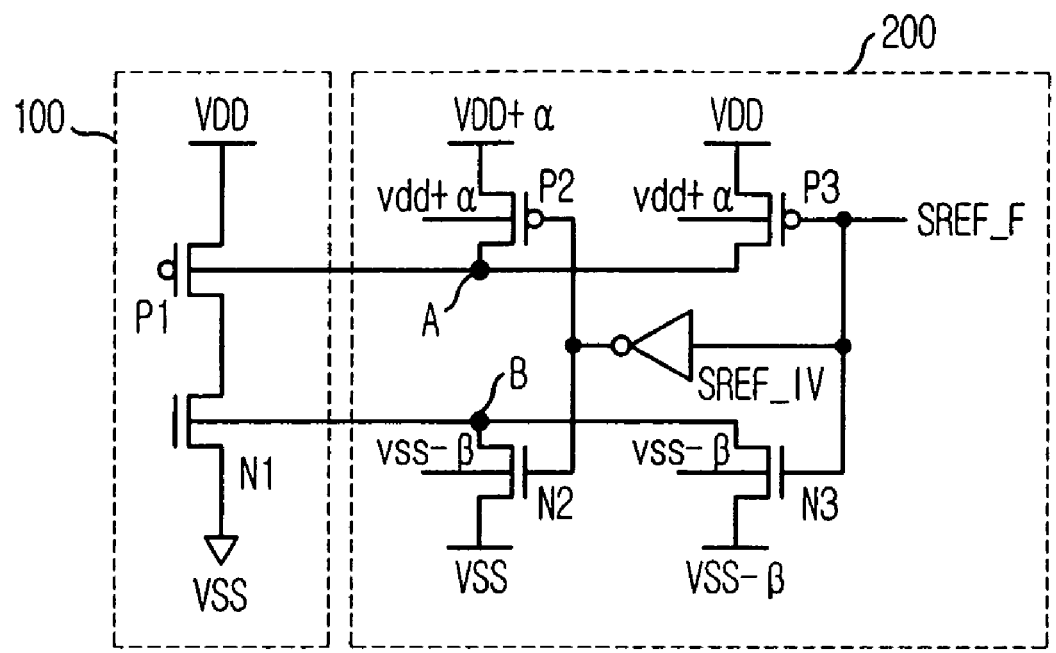
FIG. 3 is a circuit diagram describing a self refresh control device in accordance with an embodiment of the present invention.

FIG. 3 is a circuit diagram describing a self refresh control device in accordance with an embodiment of the present invention.

As shown, the self refresh control device includes a predetermined circuit including at least one MOS transistor 100 and a current control unit 200.

The predetermined circuit 100 includes a first PMOS transistor P1 and a first NMOS transistor N1 which are connected between a first source voltage VDD and a first ground voltage VSS in series. The first source voltage VDD is supplied to a source of the first PMOS transistor P1 and a voltage of a node A is supplied to a bulk of the first PMOS transistor P1. The first ground voltage VSS is supplied to a source of the first NMOS transistor N1, and a voltage of a node B is supplied to a bulk of the first NMOS transistor N1.

The current control unit 200 includes a second PMOS transistor P2, a third PMOS transistor P3, a second NMOS transistor N2, a third NMOS transistor N3, and a self refresh inverter SREF_IV.

The self refresh inverter SREF_IV inverts a self refresh flag signal SREF_F. The second PMOS transistor P2 has a source connected to the second source voltage (VDD+$\alpha$), a drain connected to the node A and a gate connected to an output of the self refresh inverter SREF_IV. The third PMOS transistor P3 has a source connected to the first source voltage VDD, a drain connected to the node A and a gate connected to the self refresh flag signal SREF_F. The second NMOS transistor N2 has a source connected to the first ground voltage VSS, a drain connected to the node B and a gate connected to the output of the self refresh inverter SREF_IV. The third NMOS transistor N3 has a source connected to the second ground voltage (VSS−$\beta$), a drain connected to the node B and a gate connected to the self refresh flag signal SREF_F.

In this time, a pumping voltage Vpp can be used as the second source voltage (VDD+$\alpha$) which is used for a voltage of a wordline. Also, a back-bias voltage VBB can be used as the second ground voltage (VSS−$\beta$) which is used for biasing a bulk voltage of cell transistors.

Figure 4:
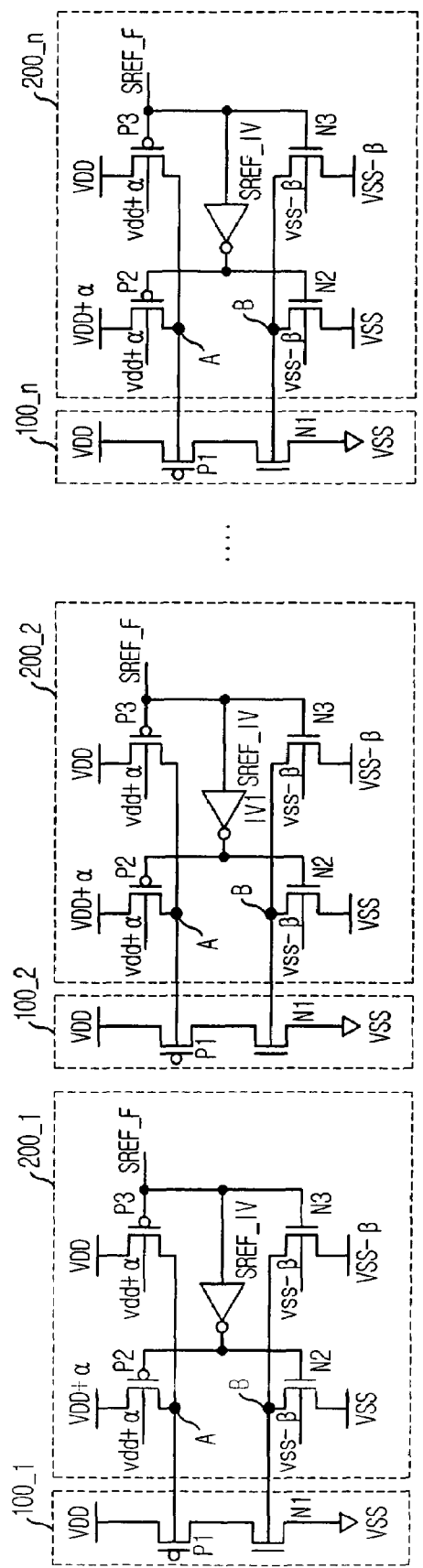
FIG. 4 is a circuit diagram depicting a self refresh control device in accordance with another embodiment of the present invention.

FIG. 4 is a circuit diagram depicting a self refresh control device in accordance with another embodiment of the present invention.

As shown, the self refresh control device includes a plurality of a predetermined circuits including at least one MOS transistor 100_1 to 100_n and a plurality of current control units 200_1 to 200_n.

Each of the predetermined circuits 100_1 to 100_n is corresponding to each of current control unit among the current control units 200_1 to 200_n.

In case that a self refresh flag signal SREF_F is activated, a second PMOS transistor P2 and a third NMOS transistor N3 turn on. Accordingly, a bulk voltage of a first PMOS transistor P1 quickly comes up to a level of a second source voltage (VDD+$\alpha$) and a bulk voltage of a first NMOS transistor N1 quickly comes down to a level of a second ground voltage (VSS−$\beta$).

In case that the self refresh flag signal SREF_F is inactivated, the third PMOS transistor P3 and the second NMOS transistor N2 turn on. Accordingly, the bulk voltage of the first PMOS transistor P1 quickly comes up to a level of the first source voltage VDD and the bulk voltage of the first NMOS transistor N1 quickly comes down to a level of the first ground voltage VSS.

As described above, if the self refresh flag signal SREF_F is activated, the bulk voltage of the first PMOS transistor P1 comes up to the second source voltage (VDD+$\alpha$). Accordingly, a threshold voltage of the first PMOS transistor P1 is increased in proportion to $\alpha$. As a result, a leakage current of the first PMOS transistor P1 during an off-state can be reduced.

Likewise, if the self refresh flag signal SREF_F is activated, the bulk voltage of the first NMOS transistor N1 comes down to the second ground voltage (VSS−$\beta$). Accordingly, the threshold voltage of the first NMOS transistor N1 is increased in proportion to $\beta$. As a result, a leakage current of the first NMOS transistor N1 during the off-state can be reduced.

Figure 5A:
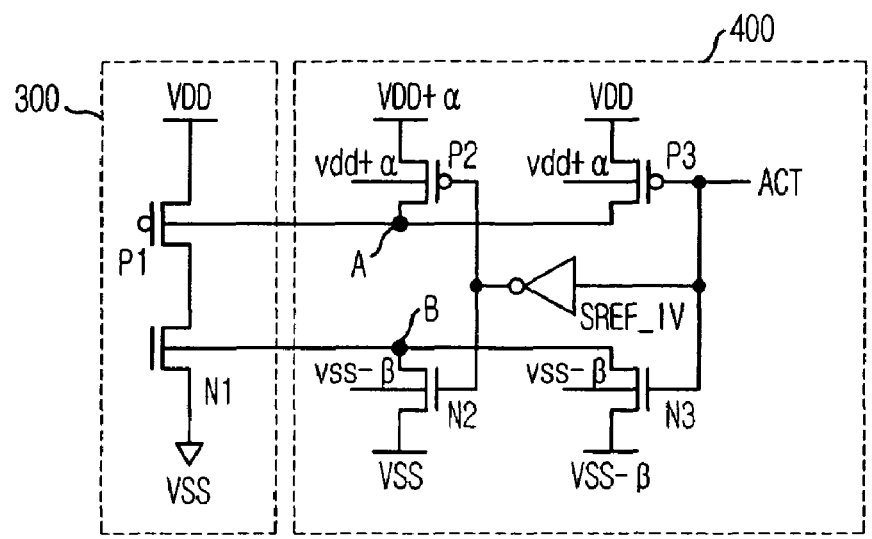
FIGS. 5A to 5C are circuit diagrams showing self refresh control devices in accordance with the other embodiments of the present invention.
Figure 5B:
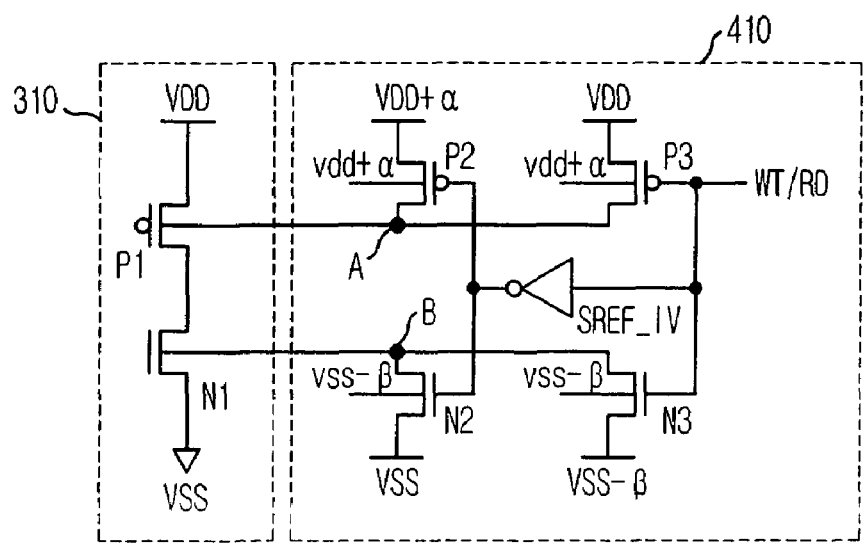
Figure 5C:
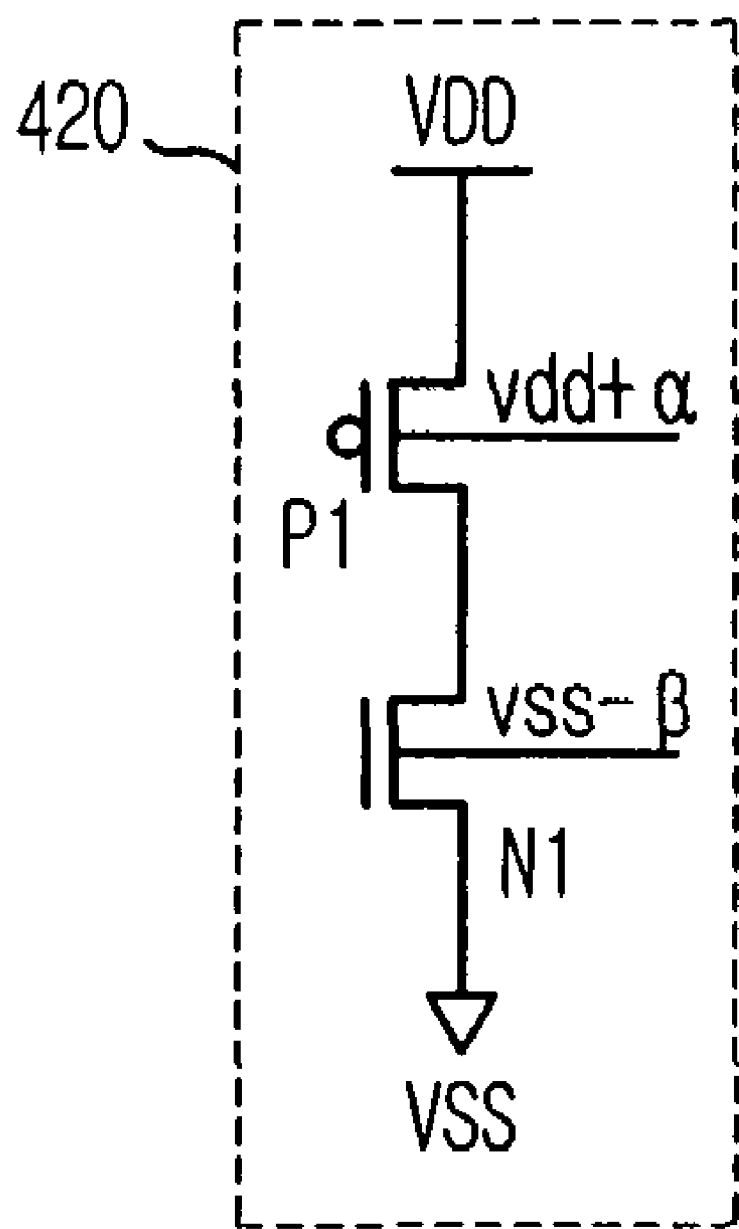

FIGS. 5A to 5C are circuit diagrams showing self refresh control devices in accordance with other embodiments of the present invention.

FIGS. 5A to 5C describe self refresh control devices in case that predetermined circuits including at least one MOS transistor are classified into their own functions.

More particularly, FIG. 5A shows a row access block 300 having a row access current control unit 400 and FIG. 5B shows a column access block 310 having a column access current control unit 410.

Also, a predetermined circuit including at least one MOS transistor in FIG. 5C is for controlling a current of a bulk in a non-critical block such as a test-mode block 420. Herein, a self refresh flag signal SREF_F is not applied to the test-mode block 420. On the other hand, a second source voltage (VDD+$\alpha$) is supplied to a bulk of a first PMOS transistor P1 and a second ground voltage (VSS−$\beta$) is supplied to a bulk of a first NMOS transistor N1 in the test-mode block 420.

Figure 6:
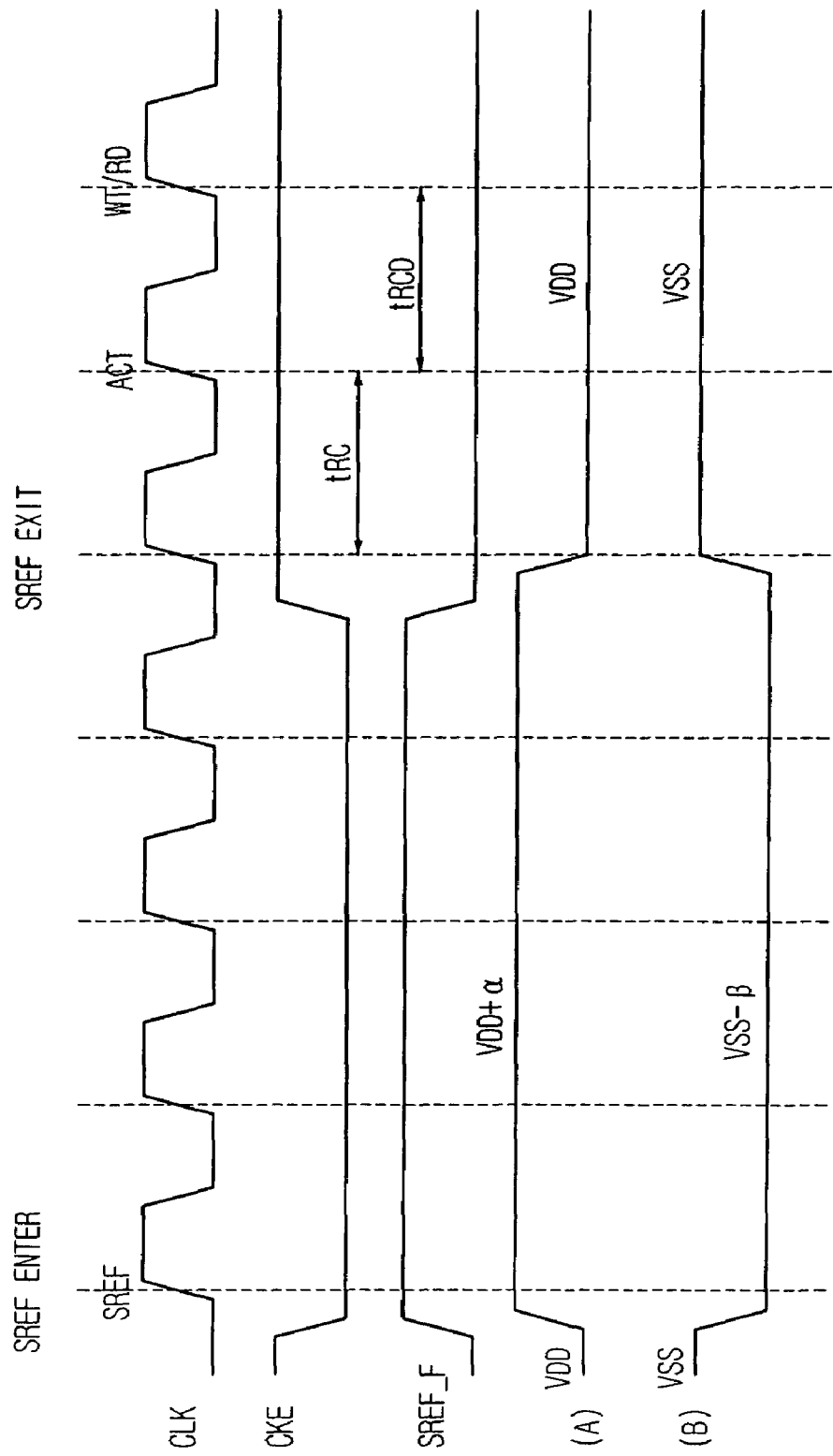
FIG. 6 is a timing diagram illustrating an operation of the self refresh control device shown in FIGS. 3 to 5C.

FIG. 6 is a timing diagram illustrating an operation of the self refresh control device shown in FIGS. 3 to 5C.

As shown, first, in a normal operation, if the self refresh flag signal SREF_F becomes a logic level 'LOW', the third PMOS transistor P3 whose source is connected to the first source voltage VDD turns on. Accordingly, the bulk voltage of the first PMOS transistor P1 in the predetermined circuit including at least one MOS transistor 100, i.e., the voltage of the node A, comes up to the first source voltage VDD.

Then, in a self refresh operation, the self refresh flag signal SREF_F becomes a logic level 'HIGH', the third PMOS transistor P3 turns off; and, at the same time, the second PMOS transistor P2 whose source is connected to the second source voltage (VDD+$\alpha$) turns on. Accordingly, the bulk voltage of the first PMOS transistor P1 in the predetermined circuit including at least one MOS transistor 100, i.e., the voltage of the node A, comes up to the second source voltage (VDD+$\alpha$).

As s result, the threshold voltage of the first PMOS transistor P1 is increased in proportion to $\alpha$. Hence, a leakage current of the first PMOS transistor P1 in an off-state can be reduced.

Likewise, in the normal operation, if the self refresh flag signal SREF_F becomes the logic level 'LOW', the second NMOS transistor N2 whose source is connected to the first ground voltage VSS turns on. Accordingly, the bulk voltage of the first NMOS transistor N1 in the predetermined circuit including at least one MOS transistor 100, i.e., the voltage of the node B, comes down to the first ground voltage VSS.

Then, in the self refresh operation, the self refresh flag signal SREF_F becomes the logic level 'HIGH', the second NMOS transistor N2 turns off; and, at the same time, the third NMOS transistor N3 whose source is connected to the second ground voltage (VSS−$\beta$) turns on. Accordingly, the bulk voltage of the first NMOS transistor N1 in the predetermined circuit including at least one MOS transistor 100, i.e., the voltage of the node B, comes down to the second ground voltage (VSS−β).

As a result, the threshold voltage of the first NMOS transistor N1 is increased in proportion to β. Hence, a leakage current of the first NMOS transistor N1 in the off-state can be reduced.

In the mean time, if the self refresh operation is finished, an active command 'ACT' can be inputted after a 'tRC'. Then, if the active command 'ACT' was inputted, a writable or readable command 'WT/RD' can be inputted after a 'tRCD'. Wherein, the 'tRC' means a 'RAS cycle time' in order to finish precharging a sense amplifier of a bitline and a wordline to thereby precharge a core of a DRAM. The 'tRCD' means a 'RAS to CAS delay time' in order to read or write a data, in reality, after the active command 'ACT' is performed.

In case that the self refresh operation is finished and the active command 'ACT' is inputted, in the row access block 300 of FIG. 5A, the first source voltage VDD of the row access current control unit 400 is supplied to a bulk of a first PMOS transistor P1. At the same time, the first ground voltage VSS of the row access current control unit 400 is supplied to a bulk of a first NMOS transistor N1.

Continuously, after the 'tRCD', the writable command or the readable command 'WT/RD' can be inputted. Hence, in the column access block 310 of FIG. 5B, the first source voltage VDD of the column access current control unit 410 is inputted to a bulk of a first PMOS transistor P1. At the same time, the first ground voltage VSS of the column access current control unit 410 is supplied to a bulk of a first NMOS transistor N1.

Figure 7:
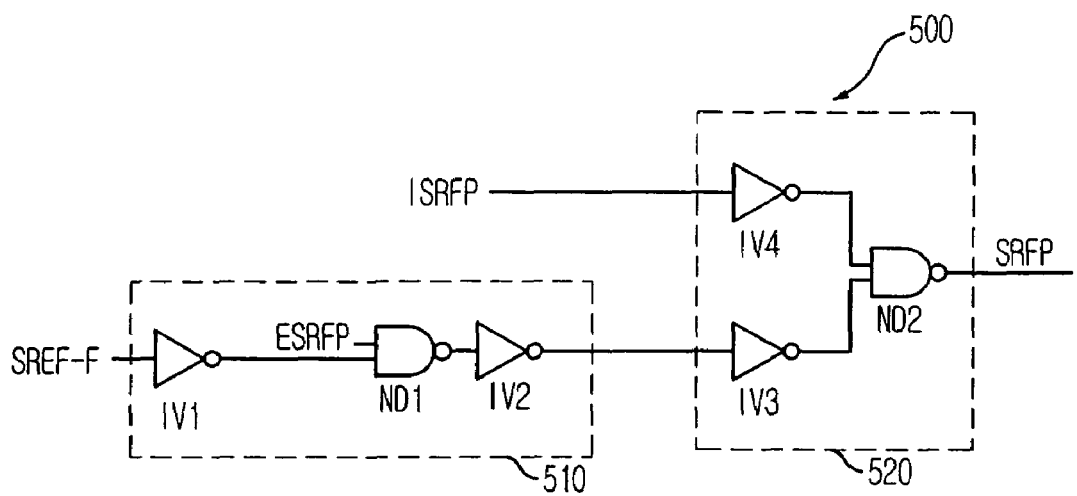
FIG. 7 is a circuit diagram showing a self refresh generating circuit block in accordance with another embodiment of the present invention.

FIG. 7 is a circuit diagram showing a self refresh generating circuit block 500 in accordance with another embodiment of the present invention.

As shown, the self refresh generating circuit block 500 includes a first logic gate 510 and a second logic gate 520.

The first logic gate 510 includes a first inverter IV1, a second inverter IV2 and a first NAND gate ND1. The second logic gate 520 includes a third inverter IV3, a fourth inverter IV4 and a second NAND gate ND2.

In the first logic gate 510, the first NAND gate ND1 performs a nand operation of an inverted self refresh flag signal SREF_F inverted by the first inverter IV1 and an external self refresh signal ESRFP. The second inverter IV2 inverts an output of the first NAND gate ND1. Accordingly, in case that the self refresh flag signal SREF_F is activated, even if the external self refresh signal ESRFP is inputted as a logic level 'HIGH', the external self refresh signal ESRFP is outputted as a logic level 'LOW'.

In the second logic gate 520, the third inverter IV3 inverts an output of the first logic gate 510 and the fourth inverter IV4 inverts an internal self refresh signal ISRFP. Then, the second NAND gate ND2 performs a nand operation of an output of the third inverter IV3 and an output of the fourth inverter IV4 to output a self refresh signal SRFP. Accordingly, in case that any one of the internal self refresh signal ISRFP and the output of the first logic gate 510 is a logic level 'HIGH', the self refresh signal SRFP is outputted as a logic level 'HIGH'.

Figure 1:
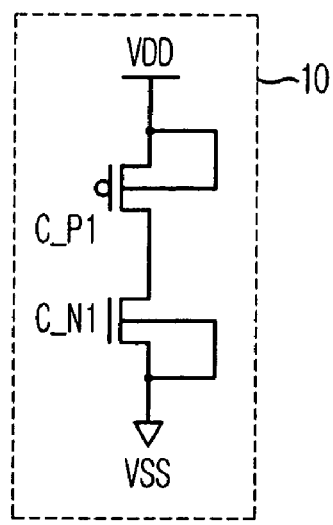
FIG. 1 is a circuit diagram of a conventional circuit showing a semiconductor memory device including MOS transistors.
Figure 2:
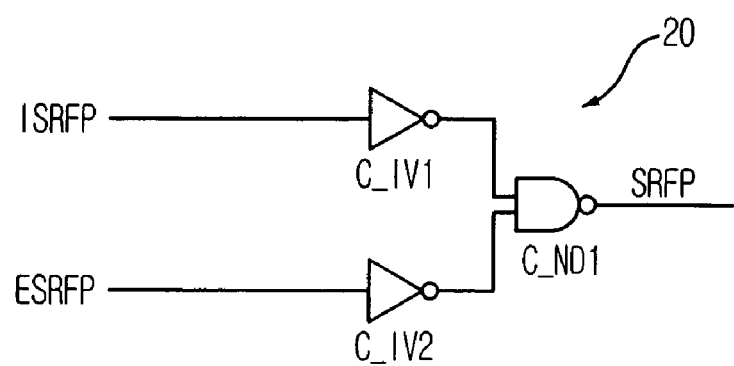
FIG. 2 is a circuit diagram showing a conventional self refresh generating circuit block.

As above described, in a conventional self refresh generating circuit block 20 shown in FIG. 2, it is possible to activate the self refresh signal SRFP in case that any of the internal self refresh signal ISRFP and the external self refresh signal ESRFP is activated. Accordingly, the refresh operation is performed repeatedly at a predetermined period, e.g., about several tens of microsecond (μs).

On the other hand, in the self refresh generating circuit block 500 shown in FIG. 7 according to the present invention, a corresponding signal to the external self refresh signal ESRFP is selectively activated. Namely, the corresponding signal to the external self refresh signal ESRFP is activated only if the self refresh flag signal SREF_F is inactivated. Accordingly, if the self refresh flag signal SREF_F is activated, whether the self refresh signal SRFP is activated or not depends on the internal self refresh signal ISRFP.

Figure 8:
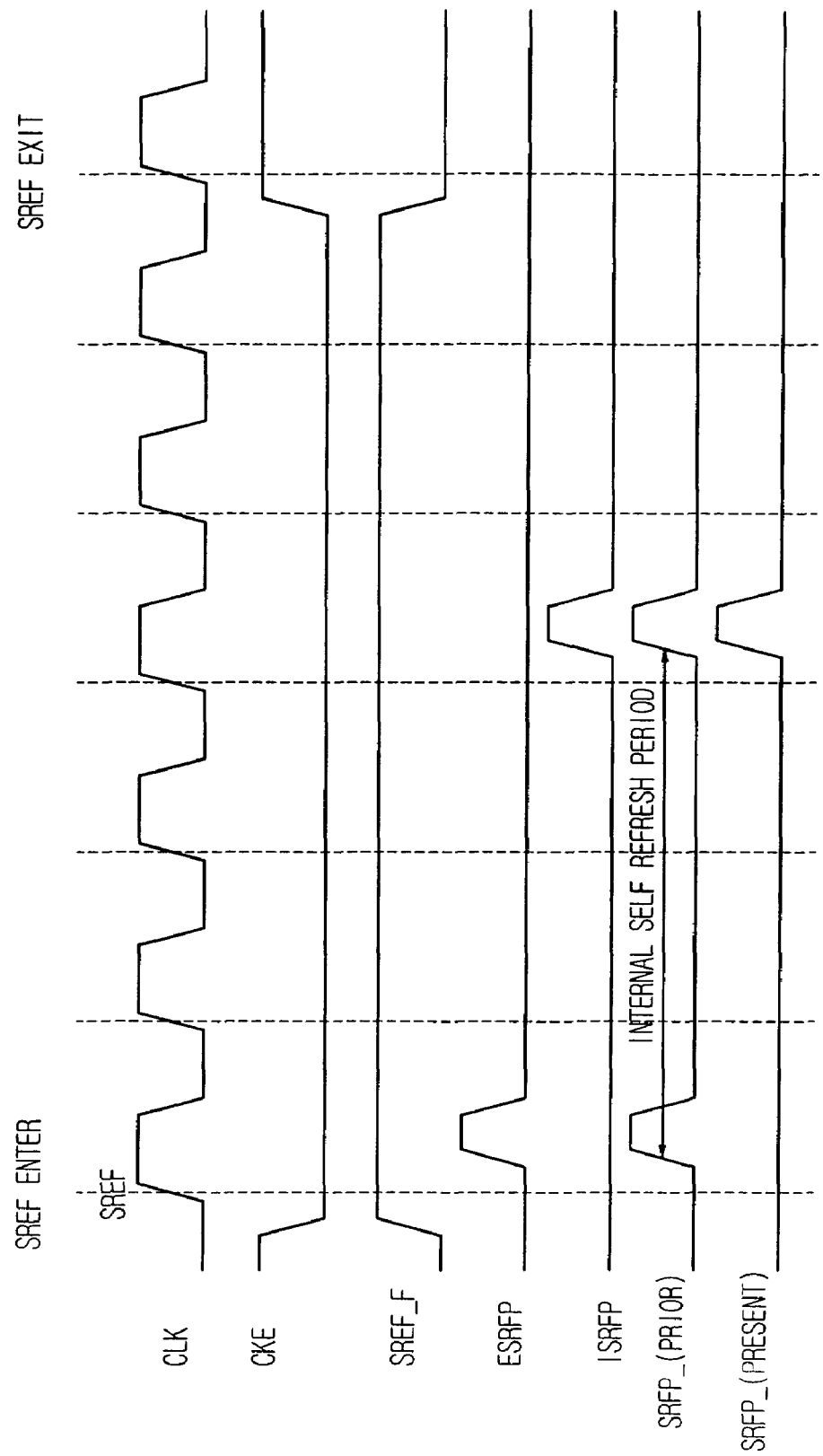
FIG. 8 is a timing diagram illustrating an operation of the self refresh generating circuit block of FIG. 7.

More particularly, FIG. 8 is a timing diagram illustrating an operation of the self refresh generating circuit block 500 shown in FIG. 7.

As shown, in the self refresh generating circuit block 500, if the external self refresh signal ESRFP is inputted during an active section of the self refresh flag signal SREF_F, the self refresh operation is not performed at once.

Hence, it is possible to supply a pumping voltage VPP to a bulk voltage of the first PMOS transistor P1 in the predetermined circuit including at least one MOS transistor 100 and supply a back-bias voltage VBB to a bulk voltage of the first NMOS transistor N1 before the internal self refresh signal ISRFP is activated. Then, in case that the internal self refresh signal ISRFP is activated, the self refresh signal SRFP is activated so that the refresh operation is performed.

In accordance with the specific embodiment of the present invention, during a self refresh operation, it is possible to reduce a self refresh current by raising a bulk voltage of a PMOS transistor and going down a bulk voltage of a NMOS transistor. As a result, when the transistors are in the off-state, a leakage current of the transistors can be reduced.

The present application contains subject matter related to the Korean patent application No. KR 2005-75256, filed in the Korean Patent Office on Aug. 17, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. An apparatus for controlling a voltage used in a semiconductor memory device, comprising:
   a first voltage supplying block for supplying a first voltage to a predetermined first transistor of the semiconductor memory device in response to an inputted control signal; and
   a second voltage supplying block for supplying a second voltage to a predetermined second transistor of the semiconductor memory device in response to the inputted control signal,
   wherein the first and the second voltages are used as a bulk voltage of the predetermined first and second transistors which are coupled between a first source voltage and a first ground voltage in series,
   wherein the first voltage supplying block supplies the first voltage higher than the first source voltage to the bulk voltage of the predetermined first transistor, and the second voltage supplying block supplies a back-bias voltage lower than the first ground voltage to the bulk voltage of the predetermined second transistor in case that an external self refresh signal is inputted, and an internal self refresh signal is activated during an active section of a self refresh flag signal.

2. The apparatus as recited in claim 1, wherein the first voltage supplying block includes:
   a first unit for supplying a first source voltage as the first voltage in response to the inputted control signal; and a second unit for supplying a second source voltage higher than the first source voltage as the first voltage in response to an inverse inputted control signal.

3. The apparatus as recited in claim 2, wherein the first and second units are PMOS transistors.

4. The apparatus as recited in claim 3, wherein the PMOS transistors receive the second source voltage as a bulk voltage.

5. The apparatus as recited in claim 3, wherein the second source voltage has a level of a pumping voltage.

6. The apparatus as recited in claim 2, wherein the second voltage supplying block includes:
   a third unit for supplying a first ground voltage as the second voltage in response to the inverse inputted control signal; and
   a fourth unit for supplying a second ground voltage lower than the first ground voltage as the second voltage in response to the inputted control signal.

7. The apparatus as recited in claim 6, wherein the third and the fourth units are NMOS transistors.

8. The apparatus as recited in claim 7, wherein the NMOS transistors receive the second ground voltage as a bulk voltage.

9. The apparatus as recited in claim 7, wherein the second ground voltage has a level of a back-bias voltage.

10. The apparatus as recited in claim 6, further comprising an inverter for inverting the inputted control signal.

11. The apparatus as recited in claim 6, further comprising a signal generating block for receiving the inputted control signal, an internal self refresh signal and an external self refresh signal to generate a self refresh signal so as not to start the self refresh operation at once, even if the external self refresh signal is activated.

12. The apparatus as recited in claim 11, wherein the signal generating block includes:
    a first logic block for inactivating the external self refresh signal during the inputted control signal is activated; and
    a second logic block for receiving an output of the first logic block and the internal self refresh signal to generate the self refresh signal.

13. The apparatus as recited in claim 12, wherein the first logic block includes one more logic gates for performing an AND operation of the external self refresh signal and the inverse inputted control signal.

14. The apparatus as recited in claim 12, wherein the first logic block includes:
    a first inverter for inverting the inputted control signal;
    a first NAND gate for performing a NAND operation between an output of the first inverter and the external self refresh signal; and
    a second inverter for inverting an output of the first NAND gate.

15. The apparatus as recited in claim 12, wherein the second logic block activate the self refresh signal in case that any of the internal self refresh signal and the output of the first logic block is activated.

16. The apparatus as recited in claim 15, wherein the second logic block includes:
    a third inverter for inverting the output of the first logic block;
    a fourth inverter for inverting the internal self refresh signal; and
    a second NAND gate for performing a NAND operation between an output of the third inverter and an output of the fourth inverter to thereby generate the self refresh signal.

17. A self refresh control device, comprising:
    a first circuit unit including a first MOS transistor and a second MOS transistor connected between a first source voltage and a first ground voltage in series;
    a current control unit configured to supply a second source voltage higher than the first source voltage to a bulk of the first MOS transistor and a second ground voltage lower than the first ground voltage to a bulk of the second MOS transistor when starting a self refresh operation; and to supply the first source voltage to the bulk of the first MOS transistor and the first ground voltage to the bulk of the second MOS transistor when finishing the self refresh operation; and
    a self refresh generating block configured to generate a self refresh signal so as not to start the self refresh operation at once, even if an external self refresh signal is activated.

18. The device as recited in claim 17, wherein the first circuit unit includes row access blocks and column access blocks.

19. The device as recited in claim 17, wherein the first circuit unit is activated sequentially at regular period.

20. The device as recited in claim 17, wherein the voltage supplying unit includes:
    a third MOS transistor, connected between the second source voltage and the bulk of the first MOS transistor, including a gate receiving an inverted self refresh flag signal;
    a fourth MOS transistor, connected between the first ground voltage and the bulk of the second MOS transistor, including a gate for receiving the inverted self refresh flag signal;
    a fifth MOS transistor, connected between the first source voltage and the bulk of the first MOS transistor, including a gate receiving an self refresh flag signal; and
    a sixth MOS transistor, connected between the second ground voltage and the bulk of the second MOS transistor, including a gate for receiving the self refresh flag signal.

21. The device as recited in claim 20, wherein the third MOS transistor and the fifth MOS transistor are PMOS transistors including a bulk for receiving the second source voltage.

22. The device as recited in claim 21, wherein the fourth MOS transistor and the sixth MOS transistor are NMOS transistors including a bulk for receiving the second ground voltage.

23. The device as recited in claim 17, wherein the self refresh generating block includes:
    a first inverter for inverting the self refresh flag signal;
    a first NAND gate for performing a NAND operation between an output of the first inverter and the external self refresh signal; and
    a second inverter for inverting an output of the first NAND gate,
    a third inverter for inverting the output of the second inverter;
    a fourth inverter for inverting an internal self refresh signal; and
    a second NAND gate for performing a NAND operation between an output of the third inverter and an output of the fourth inverter to thereby generate the self refresh signal.

* * * * *